United States Patent [19]

Bürgel et al.

[11] Patent Number: 5,066,954
[45] Date of Patent: Nov. 19, 1991

[54] ANALOG TO DIGITAL CONVERTER WITH REFERENCE VOLTAGE CONTROL AND ANALOG STYLE DISPLAY

[75] Inventors: Johannes Bürgel, Tettnang; Jean L. Lamarche, Langenargen, both of Fed. Rep. of Germany

[73] Assignee: I F M Electronic GmbH, Essen, Fed. Rep. of Germany

[21] Appl. No.: 504,473

[22] Filed: Apr. 4, 1990

[30] Foreign Application Priority Data

Apr. 5, 1989 [DE] Fed. Rep. of Germany ....... 3911457

[51] Int. Cl.[5] .............................................. H03M 1/34
[52] U.S. Cl. ..................................... 341/158; 341/155
[58] Field of Search ...................... 341/155, 158, 159

[56] References Cited

U.S. PATENT DOCUMENTS

| Re. 26,274 | 10/1967 | Doyle | 341/159 |
|---|---|---|---|
| 3,371,337 | 2/1968 | Williams, Jr. | 341/159 |
| 4,365,236 | 12/1982 | Maida | 341/159 |
| 4,823,130 | 4/1989 | Wright et al. | 341/155 X |
| 4,954,827 | 9/1990 | Tung | 341/159 |
| 4,965,579 | 10/1990 | Liu et al. | 341/159 |

FOREIGN PATENT DOCUMENTS

| 0316223 | 5/1989 | European Pat. Off. | 341/158 |
|---|---|---|---|
| 1-46321 | 2/1989 | Japan | 341/158 |
| 1-46322 | 2/1989 | Japan | 341/158 |

Primary Examiner—Howard L. Williams
Attorney, Agent, or Firm—Browdy and Neimark

[57] ABSTRACT

The circuit arrangement has a plurality of comparators (3, 4, 5) and the measuring voltage on the one hand and different reference voltages on the other hand are present at the inputs (8, 9, 10, 11, 12, 13) of the comparators, and the outputs (14, 15, 16) of the comparators (3, 4, 5) contain the measurement signal. Less effort than that in accordance with the state of the art is required in that the reference voltage for the second comparator (4) is controllable with the aid of the output signal of the first comparator (3) and that the reference voltage for the third comparator (5) is controllable with the aid of the output signal of the second comparator (4), and that the measurement signal can be represented with the aid of the total of all output signals of all comparators (3, 4, 5).

20 Claims, 4 Drawing Sheets

ANALOG TO DIGITAL CONVERTER WITH REFERENCE VOLTAGE CONTROL AND ANALOG STYLE DISPLAY

BACKGROUND OF THE INVENTION

1. FIELD OF THE INVENTION

The invention relates to a method and a circuit arrangement for converting an analog measuring voltage into a digital measurement signal and is based on the fact that in accordance with the state of the art the measuring voltage on the one hand and reference voltages on the other hand are supplied to the inputs of a plurality of comparators and the measurement signal is read off at the outputs of the comparators.

2. THE PRIOR ART

If, in accordance with the state of the art, it is intended to convert a measuring voltage into, for example, a digital measuring voltage with eight discrete measured values, eight comparators are required; thus one comparator is required for each discrete measured value. This is relatively complicated, so that it is an object of the invention to recite a less complicated method or a less complicated circuit arrangement for converting an analog measuring voltage into a digital measurement signal.

The method in accordance with the invention by means of which the above identified object is attained, is firstly and essentially characterized in that the reference voltage from the second comparator is dependent on the output signal of the first comparator, that the reference voltage for the third comparator is dependent on the output signal of the first comparator and/or the output signal of the second comparator, etc., and in that the total of all output signals of all comparators represents the measurement signal in a coded form. Accordingly, the circuit arrangement in accordance with the invention is firstly and essentially characterized in that the reference voltage for the second comparator is controllable with the aid of the output signal of the first comparator, the reference voltage for the third comparator is controllable with the aid of the output signal of the first comparator and/or the output signal of the second comparator, etc., and in that the measurement signal can be represented with the aid of the total of all the output signals of all the comparators.

In accordance with the state of the art, eight comparators are required if a measuring voltage in the range of, for example, 0 V to 8 V is to be converted into a digital measurement signal in such a way that eight discrete measured values can be represented; the output of the first comparator represents the value 0–1 V, the output of the second comparator the value 1–2 V, etc., the output of the eighth comparator the value 7–8 V. In contrast to this, in accordance with the invention three comparators are sufficient and each discrete measured value is represented by the total of all output signals of all comparators, namely by a measurement signal comprised of three bits and present in coded form.

As stated above, a method and a circuit arrangement for converting an analog measuring voltage into a digital measurement signal are the object of the invention. However, this need not be a linear conversion. It is possible to make any desired connection between the analog measuring voltage and the digital measurement signal; for example, the digital measurement signal to be realized can depend logarithmically or quadratically on the analog measuring voltage to be converted. Basically it is therefore possible with the use of the method according to the invention to convert the measurement voltage into an auxiliary voltage associated in the manner previously indicated with the measuring voltage and to first supply the auxiliary voltage to the inputs of the comparators.

Regarding the dependence of the digital measurement signal on the analog measuring voltage to be converted, a further teaching of the invention which, separately from the teaching of the invention described so far, is of distinct inventive importance, is characterized in that the measuring voltage is compared with a switch reference voltage and that at the time when the measuring voltage attains the switch reference voltage a switch signal is generated. Then, when the measuring voltage lies below the switch reference voltage, the difference between the switch reference voltage and the measuring voltage is preferably obtained as auxiliary voltage and when the measuring voltage lies above the switch reference voltage, the difference between the measuring voltage and the switch reference voltage is obtained. The circuit arrangement corresponding to this, which is also of independent inventive importance, is characterized in that a voltage converter is provided at the input side and in that the voltage converter converts the measuring voltage into an auxiliary voltage assigned to the measuring voltage, the voltage converter preferably having a threshold switch, and in that the threshold switch generates a switch signal at the time when the measuring voltage reaches the switch reference voltage, the voltage converter furthermore preferably having a differential amplifier and an inverter and, finally, the differential amplifier and the inverter preferably generating at the time when the measuring voltage lies below the switch reference voltage, the difference between the switch reference voltage and the measuring voltage as auxiliary voltage and generating at a time when the measuring voltage lies above the switch reference voltage, the difference between the measuring voltage and the switch reference voltage as auxiliary voltage.

In detail there are many possibilities to arrange and improve the teaching of the invention. On the one hand, reference is made to the claims dependent on claim 1. On the other hand, the drawings having as their content a preferred embodiment of a circuit arrangement in accordance with the invention, serve as a description.

Figure 2:
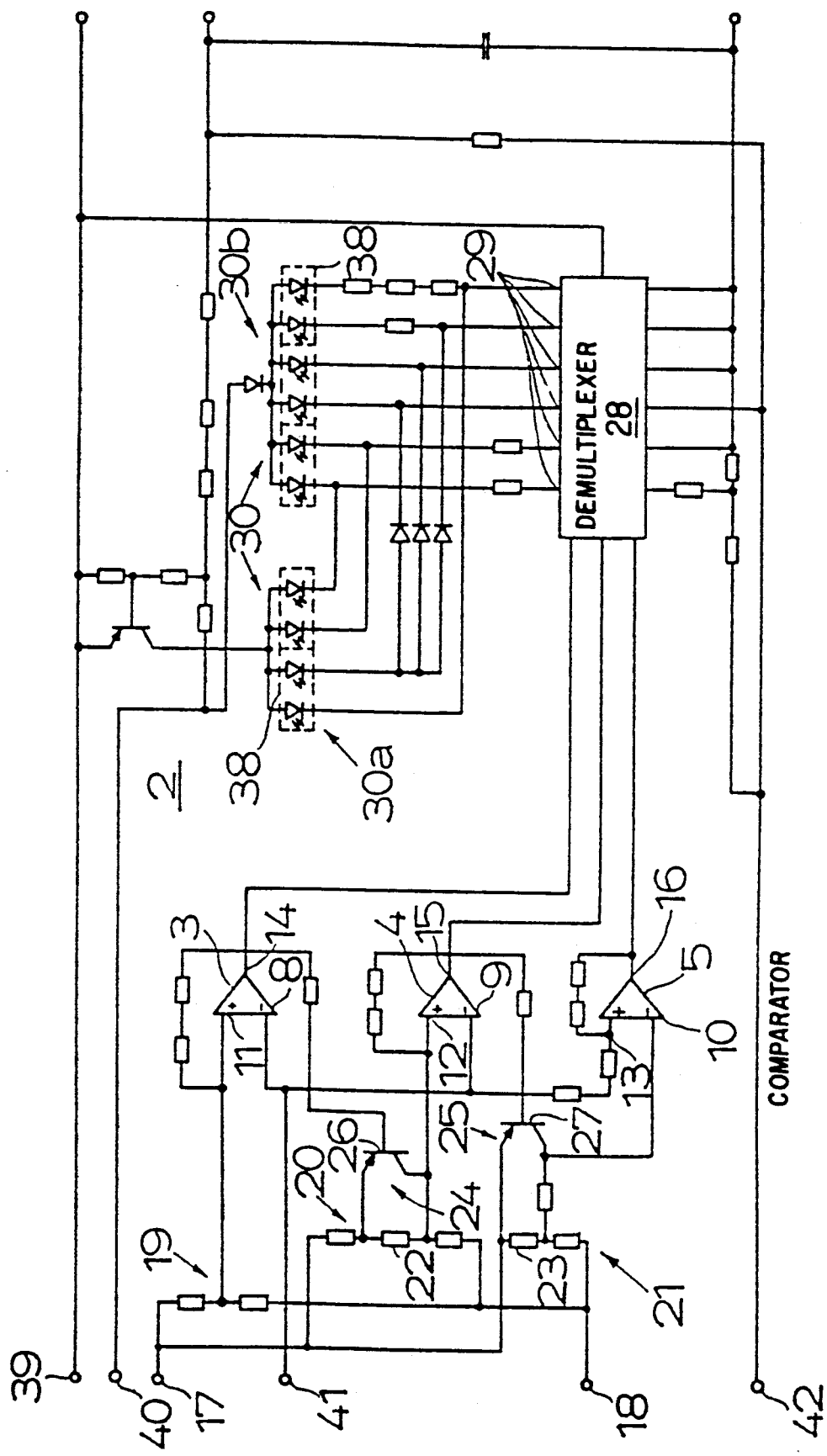
FIG. 2 shows the comparator and display element of the preferred embodiment of a circuit arrangement in accordance with the invention.
Figure 3:
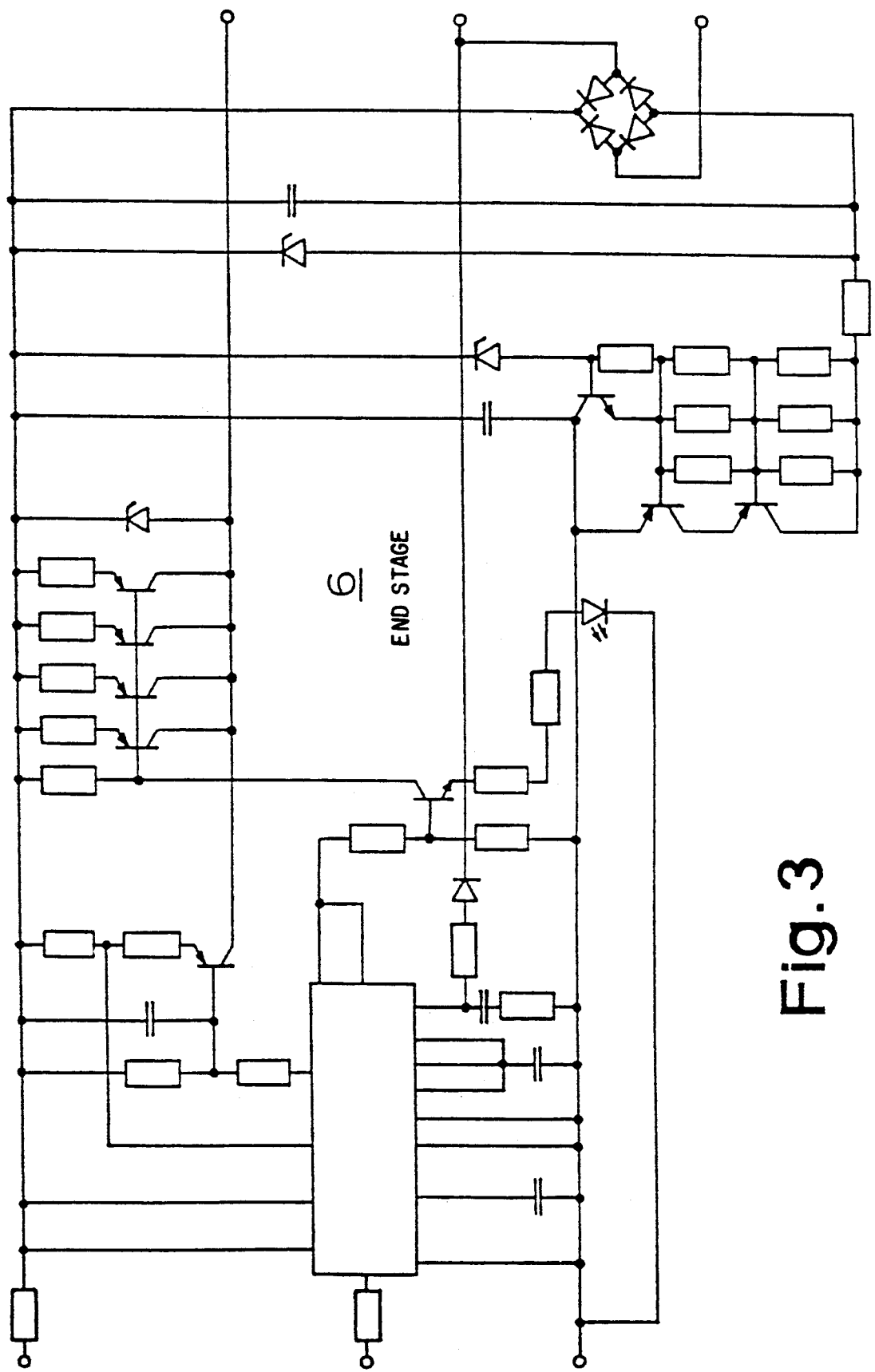
FIG. 3 shows the end stage element of the preferred embodiment of a circuit arrangement in accordance with the invention.

The circuit arrangement shown in the drawings is used for converting an analog measuring voltage into a digital measurement signal and comprises in its basic structure an input and converter element 1 (FIG. 1), a comparator element 2 (FIG. 2) with a plurality of comparators 3, 4 and 5 and an end stage element 6 (FIG. 3). In the exemplary embodiment shown, the analog measuring voltage to be converted into a digital measurement signal is generated by a sensor 7, for example a flow monitor.

Fundamentally the circuit arrangement in accordance with the invention provides that the measuring voltage on the one hand and various reference voltages on the other hand are present at the inputs 8 to 13 of the comparators 3 to 5 and that the outputs 14, 15, 16 of the comparators 3 to 5 contain the measurement signal.

In accordance with the invention it is possible to control, with the aid of the output signal of the first comparator 3, the reference voltage for the second comparator 4 and with the aid of the output signal of the second comparator 4 the reference voltage for the third comparator and to represent the measurement signal with the aid of the total of all output signals of all comparators 3 to 5.

In the exemplary embodiment shown, one reference voltage is first provided for obtaining the reference voltages, and this by providing voltage dividers 19, 20, 21 between the points 17 and 18 and connecting the voltage dividers 19, 20, 21 to the reference voltage. The voltage divider 20 for the reference voltage of the second comparator 4 and the voltage divider 21 for the reference voltage of the third comparator 5 each have a voltage divider resistor 22, 23, which can be short-circuited. Control transistors 24, 25, the bases 26, 27 which are connected to the first output 14 of the first comparator 3 or to the output 15 of the second comparator 4, are associated with the voltage divider resistors 22, 23 which can be short-circuited. An analog demultiplexer 28 is connected to the outputs 14, 15, 16 of the comparators 3, 4, 5. LEDs 30 are connected to the outputs 29 of the analog demultiplexer 28.

It is true in connection with the circuit arrangement described so far, that the reference voltage for the second comparator 4 is dependent on the output signal of the first comparator 3, and the reference voltage for the third comparator 5 is dependent on the output signal of the second comparator 4 and that the total of all output signals of all comparators 3, 4 and 5 represents the measurement signal in coded form, that the reference voltages were obtained from one reference voltage, namely with the aid of the voltage dividers 19, 20, 21, that the voltage divider 20 for the reference voltage of the second comparator 4 and the voltage divider 21 for the reference voltage of the third comparator 5 each have voltage divider resistors 22, 23, which can be short-circuited, that the voltage divider resistors 22, 23, which can be short-circuited, are short-circuited with the aid of control transistors 24, 25, and the control transistors 24, 25 can be controlled by the output signal of the first comparator 3 and the output signal of the second comparator 4, that the total of all output signals of all comparators 3, 4 and 5 control the analog demultiplexer 28 and that the outputs 29 of the analog demultiplexer 28 control the LEDs 30.

Figure 1:
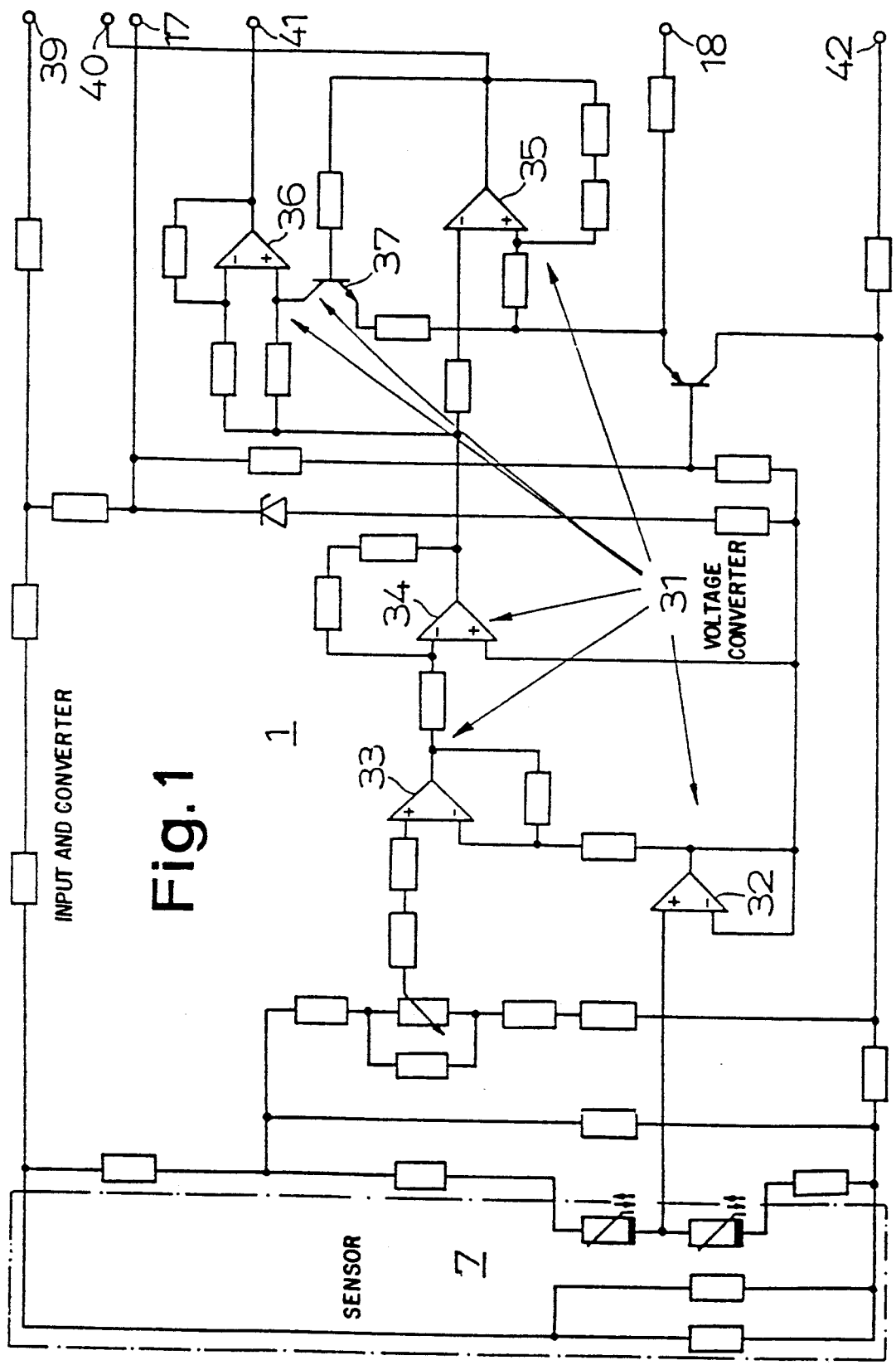
FIG. 1 shows the input and converter element of the preferred embodiment of a circuit arrangement in accordance with the invention.
Figure 4:
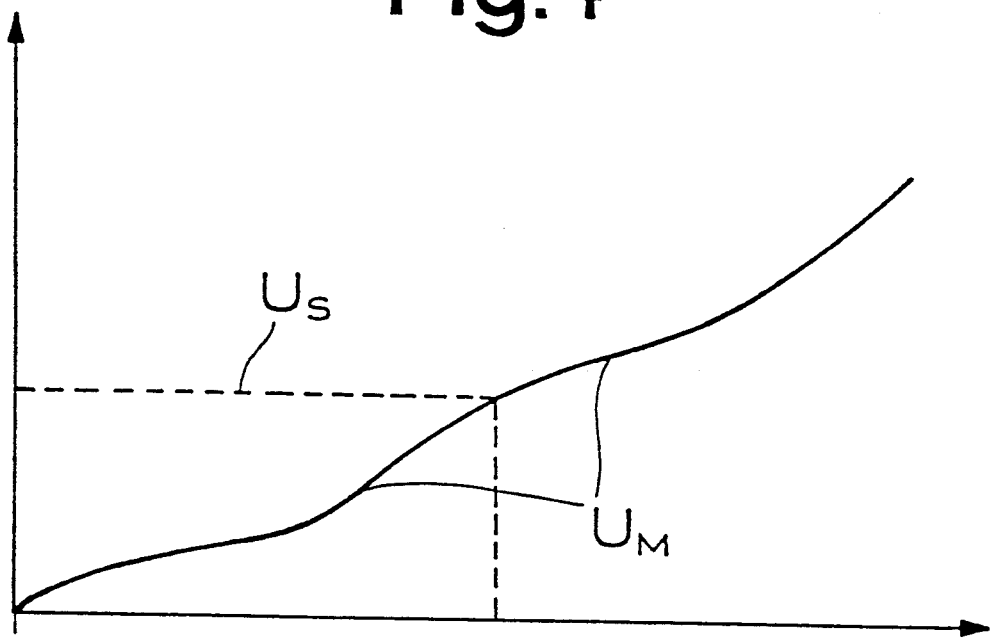
FIG. 4 shows by way of example the course of an analog measuring voltage which is to be converted into a digital measurement signal.
Figure 5:
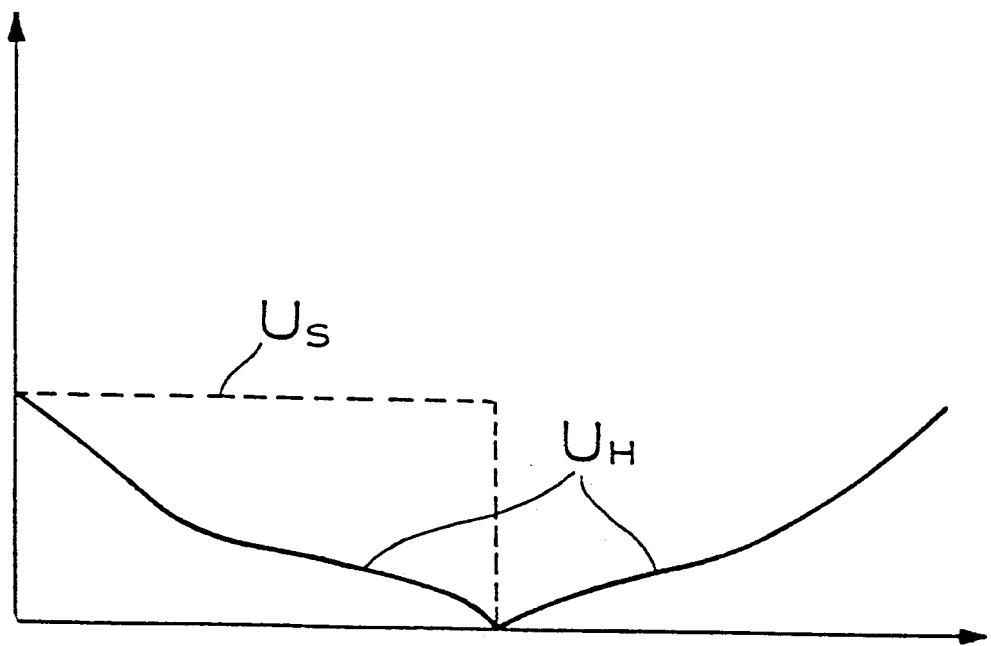
FIG. 5 is a graphic representation to explain the input and converter element in accordance with FIG. 1.

As shown by FIG. 1, in the illustrated exemplary embodiment of a circuit arrangement in accordance with the invention, a voltage converter 31 is provided on the input side, which converts the measuring voltage into an auxiliary voltage assigned to the measuring voltage; in the exemplary embodiment shown the measuring voltage is not directly fed to the inputs 8, 10, 12 of the comparators 3, 4, 5, instead the auxiliary voltage assigned to the measuring voltage is. In detail, the voltage converter 31 has an impedance converter 32, two amplifiers 33, 34, a threshold switch 35, a differential amplifier 36 and an inverter 37. With the aid of the threshold switch 35 the measuring voltage is compared with a switch reference voltage and, when the measuring voltage has reached the switch reference voltage, a switch signal is generated. Then, when the measuring voltage lies below the switch reference voltage, the differential amplifier 36 and the inverters 37 generate the difference between the switch reference voltage and the measuring voltage as auxiliary voltage and, when the measuring voltage lies above the switch reference voltage, generate the difference between the measuring voltage and the switch reference voltage as auxiliary voltage. This is shown in FIGS. 4 and 5, in which the measuring voltage is indicated as $U_M$, the switch reference voltage with $U_S$, and the auxiliary voltage as $U_H$.

As shown in FIG. 2, in the illustrated exemplary embodiment, pairs of LEDs each are connected to the outputs 29 of the analog demultiplexer, namely red LEDs 30a and green LEDs 30b. Either the red LEDs 30a or the green LEDs 30b are "preprogrammed" with the aid of the threshold switch 35. Therefore, depending on which output 29 of the demultiplexer 28 is "switched through" and depending on the output signal of the threshold switch 35, either the red LED 30a or the green LED 30b lights up.

As already mentioned, the analog measuring voltage $U_M$, which is converted into a digital measurement signal with the aid of the circuit arrangement of the invention, originates from the sensor 7 in the form of a flow monitor. The measuring voltage $U_M$ put out by the sensor 7 increases with increased flow; if the flow lies below a pre-selected set value, the measuring voltage $U_M$ lies below the switch reference voltage $U_S$, if the flow lies above the pre-selected set value, the measuring voltage $U_M$ lies above the switch reference voltage $U_S$. Thus, depending on the amount of flow, one of the LEDs 30 shown in FIG. 2 will light, a red LED 30a, if the flow lies below the set value; a green LED 30b, if the flow lies above the set value. Therefore the LEDs 30 give a pseudo-analog indication—from left to right in FIG. 2—of the speed of the flow monitored by the sensor 7 in the form of a flow monitor.

It has been indicated in FIG. 2 that each of a pair of red LEDs 30a or a pair of green LEDs 30b have a common anode and are provided in a common housing 38, namely in a housing of the structural type SOT 23. This teaching has, apart from the other teachings of the invention, its own independent inventive importance.

To the extent that the circuit arrangement in accordance with the invention shown in FIGS. 1, 2 and 3 has not been previously described in detail in respect to all components, these components as well as the arrangement of these components, which is easily seen from FIGS. 1, 2 and 3, have inventive importance.

What is claimed is:

1. A circuit arrangement for converting an analog measured voltage into a digital measurement signal, having
  a plurality of comparators, where the measured voltage and various reference voltage dividers are provided for obtaining the reference voltages and the voltage dividers are connected to a standard voltage, where the reference voltage for the second comparator is controllable by the initial signal of the first comparator, a reference voltage for the third comparator which is controllable by the output signal of the first comparator, the output signal of the second comparator or both the output signals of the first and second comparators, and where the measurement signal displayable by the sum of the output signals of all comparators, where the voltage divider for the reference voltage of the second comparator and the voltage divider for the reference voltage of the third comparator each have a voltage divider resistor which can be short-circuited, where control transistors are assigned to the voltage divider resistors which can be short-circuited, where the base of each of the control transistors is connected to the output of a comparator, and where an analog demultiplexer is connected to the outputs of the comparators.

2. A circuit arrangement in accordance with claim 1, wherein LEDS are connected to the outputs of the analog demultiplexer.

3. A circuit arrangement in accordance with claim 1, wherein at the input the measurement voltage is converted by a voltage converter into an auxiliary voltage assigned to the measurement voltage.

4. A circuit arrangement in accordance with claim 3, wherein the voltage converter has an impedance transformer.

5. A circuit arrangement in accordance with claim 3, wherein the voltage converter has at least one amplifier.

6. A circuit arrangement in accordance with claim 3, wherein the voltage converter has a threshold value switch and that the threshold value switch generates a switching signal when the measured voltage has reached the switching reference voltage.

7. A circuit arrangement in accordance with claim 6, wherein at least one pair of LEDS, namely a red LED and a green LED, are connected to each one of the outputs of the analog demultiplexer.

8. A circuit arrangement in accordance with claim 7, wherein either the red LEDs or the green LEDs are "preprogrammed" with the aid of the threshold value switch.

9. A circuit arrangement in accordance with claim 3, wherein the voltage converter has a differential amplifier.

10. A circuit arrangement in accordance with claim 9, wherein the differential amplifier and the inverter generate as auxiliary voltage the difference between the switching reference voltage and the measured voltage when the measured voltage lies below the switching reference voltage and generate as auxiliary voltage the difference between the measured voltage and the switching reference voltage, when the measured voltage lies above the switching reference voltage.

11. A circuit arrangement in accordance with claim 3, wherein the voltage converter has an inverter.

12. A circuit arrangement for converting an analog measured voltage into a digital measurement signal, having a plurality of comparators, where the measured voltage and various reference voltage dividers are provided for obtaining the reference voltages and the voltage dividers are connected to a standard voltage, where the reference voltage for the second comparator is controllable by the initial signal of the first comparator, a reference voltage for the third comparator which is controllable by the output signal of the first comparator, the output signal of the second comparator or both the output signals of the first and second comparators, and where the measurement signal displayable by the sum of the output signals of all comparators, where the voltage divider for the reference voltage of the second comparator and the voltage divider for the reference voltage of the third comparator each have a voltage divider resistor which can be short-circuited, where control transistors are assigned to the voltage divider resistors which can be short-circuited, where the base of each of the control transistors is connected to the output of a comparator, and wherein the total of all output signals of all comparators controls an analog demultiplexer.

13. A circuit arrangement for converting an analog measured voltage into a digital measurement signal, having a plurality of comparators, where the measured voltage and various reference voltage dividers are provided for obtaining the reference voltages and the voltage dividers are connected to a standard voltage, where the reference voltage for the second comparator is controllable by the initial signal of the first comparator, a reference voltage for the third comparator which is controllable by the output signal of the first comparator, the output signal of the second comparator or both the output signals of the first and second comparators, and where the measurement signal displayable by the sum of the output signals of all comparators, where the voltage divider for the reference voltage of the second comparator and the voltage divider for the reference voltage of the third comparator each have a voltage divider resistor which can be short-circuited, where control transistors are assigned to the voltage divider resistors which can be short-circuited, where the base of each of the control transistors is connected to the output of a comparator, and wherein the measuring voltage is compared with a switch reference voltage and a switch signal is generated when the measuring voltage has reached the switch reference voltage.

14. A circuit arrangement in accordance with claim 13, wherein, when the measuring voltage leis below the switch reference voltage, the difference between the switch reference voltage lies above the switch reference voltage, the difference between the measuring voltage and the switch reference voltage is obtained.

15. A circuit arrangement for converting an analog measured voltage into a digital measurement signal, having a plurality of comparators, where the measured voltage and various reference voltage dividers are provided for obtaining the reference voltages and the voltage dividers are connected to a standard voltage, where the reference voltage for the second comparator is controllable by the initial signal of the first comparator, a reference voltage for the third comparator which is controllable by the output signal of the first comparator, the output signal of the second comparator or both the output signals of the first and second comparators, and where the measurement signal displayable by the sum of the output signals of all comparators, where the voltage divider for the reference voltage of the second comparator and the voltage divider for the reference voltage of the third comparator each have a voltage divider resistor which can be short-circuited, where control transistors are assigned to the voltage divider resistors which can be short-circuited, where the base of each of the control transistors is connected to the output of a comparator, and wherein the measuring voltage is compared with a switch reference voltage and a switch signal is generated when the measuring voltage has reached the switch reference voltage.

16. A circuit arrangement for converting an analog measured voltage into a digital measurement signal, with a plurality of comparators, where the measuring voltage and reference voltages are present on the inputs of the comparators and the outputs of the comparators contain the measurement signal, wherein with the aid of the output signal of the first comparator (3) the reference voltage for the second (4) is controlled and with the aid of the output signal of the first comparator and-/or the output signal of the second comparator (4) the reference voltage for the third comparator (5) is controlled, wherein with the aid of the total of all output signals of all comparators (3, 4, 5), the measurement signal can be represent, and wherein a voltage converter (31) is provided on the input side, an din that the voltage converter (31) converts the measuring voltage into an auxiliary voltage assigned to the measuring voltage, and wherein the voltage converter (31) has a threshold switch (35) and in that the threshold switch (35) generates a measurement signal at the time when the measuring voltage reaches the switch reference voltage.

17. A circuit arrangement in accordance with claim 16 wherein with the aid of the threshold switch (35) either the red LEDs (30a) or the green LEDs (30b) are "preprogrammed".

18. A circuit arrangement for converting an analog measured voltage into a digital measurement signal, with a plurality of comparators, where the measured voltage and reference voltages are present on the inputs of the comparators and the outputs of the comparators contain the measurement signal, wherein with the aid of the output signal of the first comparator (3) the reference voltage for the second (4) is controlled and with the aid of the output signal of the first comparator and-/or the output signal of the second comparator (4) the reference voltage for the third comparator (5) is controlled, wherein with the aid of the total of all output signals of all comparators (3, 4, 5), the measurement signal can be represent, and wherein a voltage converter (31) is provided on the input side, an din that the voltage converter (31) converts the measuring voltage into an auxiliary voltage assigned to the measuring voltage, and wherein the voltage converter (31) has a threshold switch (35) and in that the threshold switch (35) generates a measurement signal at the time when the measuring voltage reaches the switch reference voltage, and wherein the voltage converter (31) has a differential amplifier (36).

19. A circuit arrangement in accordance with claim 18 wherein the differential amplifier (36) and the inverter (37) generate, when the measuring voltage lies below the inverter (37) generate, when the measuring voltage lies below the switch reference voltage, the difference between the switch reference voltage and the measuring voltage as auxiliary voltage, and, when the measuring voltage lies above the switch reference voltage, generate the difference between the measuring voltage and the switch reference voltage as auxiliary voltage.

20. A circuit arrangement for converting an analog measuring voltage into a digital measurement signal, with a plurality of comparators, where the measuring voltage and reference voltages are present on the inputs of the comparators and the outputs of the comparators contain the measurement signal, wherein with the aid of the output signal of the first comparator (3) the reference voltage for the second (4) is controlled and with the aid of the output signal of the first comparator and-/or the output signal of the second comparator (4) the reference voltage for the third comparator (5) is controlled, wherein with the aid of the total of all output signals of all comparators (3, 4, 5), the measurement signal can be represent, and wherein a voltage converter (31) is provided on the input side, and in that the voltage converter (31) converts the measuring voltage into an auxiliary voltage assigned to the measuring voltage, wherein the voltage converter (31) has a threshold switch (35) and in that the threshold switch (35) generates a measurement signal at the time when the measuring voltage reaches the switch reference voltage, wherein the voltage converter (31) has a differential amplifier (36), and wherein the voltage converter (31) has an inverter (37).

* * * * *